United States Patent [19]

Kubo

[11] Patent Number: 5,334,866
[45] Date of Patent: Aug. 2, 1994

[54] INTEGRATED CIRCUIT DEVICE WITH FUNCTIONS SELECTABLE BY CHANGING INTERCONNECTION PATTERN

[75] Inventor: Kenki Kubo, Hyogo, Japan

[73] Assignee: Mitsubishi Denki Kabushiki Kaisha, Tokyo, Japan

[21] Appl. No.: 989,446

[22] Filed: Dec. 11, 1992

[30] Foreign Application Priority Data

Jan. 6, 1992 [JP] Japan .................. 4-000307

[51] Int. Cl.⁵ ........................ H01L 23/48
[52] U.S. Cl. ........................ 257/207; 257/208; 257/209; 257/773; 257/786; 307/303.1
[58] Field of Search ............ 257/207, 208, 209, 773, 257/786, 536; 307/303.1

[56] References Cited

U.S. PATENT DOCUMENTS

| | | | |
|---|---|---|---|
| 4,558,345 | 12/1985 | Dwyer et al. | 257/786 |
| 5,164,814 | 11/1992 | Okumura | 257/530 |

FOREIGN PATENT DOCUMENTS

| | | | |
|---|---|---|---|
| 60-43855 | 3/1985 | Japan | 258/536 |
| 62-104065 | 5/1987 | Japan | 257/536 |
| 1-12569 | 1/1989 | Japan | 257/536 |
| 4-188643 | 7/1992 | Japan | 307/303.1 |

*Primary Examiner*—Robert Limanek
*Attorney, Agent, or Firm*—Lowe, Price, LeBlanc & Becker

[57] ABSTRACT

A semiconductor device includes an internal circuit for deciding an internal state, as well as a Vcc supply interconnection and a reference supply interconnection having ends disposed at the vicinity of an input terminal of the internal circuit. Either an end of the Vcc supply interconnection or an end of the reference supply potential is connected to an input terminal of the internal circuit in accordance with a specification of the semiconductor device. A connecting portion for this connection has portions, which are opposed to each other with a space smaller than a diameter of a wire for bonding and are connected by material of the wire in a wire bonding step. These structures can facilely comply with change of the specification, and an area required for interconnections is reduced in the semiconductor device.

11 Claims, 8 Drawing Sheets

INTEGRATED CIRCUIT DEVICE WITH FUNCTIONS SELECTABLE BY CHANGING INTERCONNECTION PATTERN

BACKGROUND OF THE INVENTION

1. Field of the Invention

The present invention relates to a semiconductor device including an interconnection structure formed between an internal circuit, which decides a specification of the semiconductor device, and power supply leads.

2. Description of the Background Art

Various methods have been used for manufacturing semiconductor devices of which functions are selected by changing interconnection patterns at final stages in manufacturing processes in accordance with specifications of the semiconductor devices. For example, FIG. 10 schematically shows a semiconductor device of a bonding option type in the prior art. FIGS. 11 and 12 schematically show a semiconductor device of a master slice type. Referring to FIGS. 10–12, an IC chip 6 is provided at its surface with bonding pads 1a and 1b corresponding to a Vcc supply lead 7 and a reference (GND) supply lead 8. The IC chip 6 is provided with an internal circuit 2 for deciding the internal state. The internal circuit 2 receives a signal of "H" or "L". The internal circuit 2 discriminates a level of the supplied signal, and generates a signal for changing the specification of the circuitry in the IC chip 6 in accordance with the supplied signal. Therefore, the internal circuit 2 is connected to either the Vcc supply lead 7 or the GND supply lead 8.

In the type shown in FIG. 10, the bonding pads 1a and 1b are connected to the internal circuit 2 through a dedicated power supply interconnection 5. Only the Vcc supply lead 7 is connected to the boding pad 1a through a bonding wire 9, or only the GND supply lead 8 is connected to the boding pad 1d through the bonding wire 9, whereby the signal supplied to the internal circuit 2 is decided. The type described above is referred to as the "bonding option type".

In FIGS. 11 and 12, both the Vcc supply lead 7 and the GND supply lead 8 are connected to the bonding pads 1a and 1b through the bonding wires 9, respectively. Only one of dedicated power supply interconnections 5a and 5b, which are connected to the bonding pads 1a and 1b, respectively, is connected to the internal circuit 2, whereby the level of the signal applied to the internal circuit 2 is decided. The type described above is referred to as the "master slice type". For the master slice type, patterning masks complying with the specifications are prepared for manufacturing the power supply interconnections in the manufacturing process of ICs, and thereby the interconnection pattern shown in FIG. 10 or 11 is formed.

However, in order to decide the specification of the IC chip, the bonding option type shown in FIG. 10 requires the lead 7 (or 8) which is not used as well as the corresponding bonding pad 1a (or 1b), which impedes the reduction of a size of the IC chip 6. Further, the power supply interconnection 5 connected to the unused bonding pad 1a (or 1b) also requires a certain area on the surface of the IC chip 6, which also impedes the reduction of the size of the IC chip 6.

The master slice type shown in FIGS. 11 and 12 requires a plurality of patterning masks having different interconnection patterns corresponding to the specifications, which is not preferable in view of the manufacturing process and manufacturing cost.

SUMMARY OF THE INVENTION

Accordingly, it is an object of the invention to provide a semiconductor device, which can be facilely manufactured in accordance with change of a specification and allows reduction of unnecessary interconnection areas.

A semiconductor device according to the invention includes a semiconductor substrate having a major surface, a power supply lead which is opposed to the semiconductor substrate for receiving a predetermined electric potential, and a power supply pad formed on the major surface of the substrate. The power supply pad and the power supply lead are connected through a power supply wire. On the semiconductor substrate, there are formed a power supply interconnection electrically connected to the power supply pad, and an internal circuit for deciding a specification of the semiconductor device or inhibiting use of a circuit formed on the semiconductor substrate. To the internal circuit is connected an internal circuit interconnection having a portion, which is opposed to a predetermined portion of the power supply interconnection with a predetermined space therebetween. The space between the opposed portions is smaller than a diameter of a bonding wire at a connecting portion between the power supply wire and the power supply pad.

In the semiconductor device according to the invention, the connection between the power supply interconnection and the internal circuit is decided by whether the internal circuit is connected to the power supply interconnection or not. Therefore, the power supply interconnection can also be used as an interconnection connected to another circuit, and thus an interconnection, pad and others dedicated to the internal circuit are not required. Thereby, an unnecessary interconnection area on the semiconductor substrate can be eliminated. Also, the power supply interconnection and the internal circuit interconnection have the portions opposed to each other with the space therebetween which is smaller than the diameter of the bonding wire. Therefore, the power supply interconnection and the internal circuit interconnection can be connected, using material of the bonding wire in the bonding step for bonding the power supply lead and the power supply pad.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Preferred embodiments of the invention will be described below with reference to the drawings.

Figure 1:
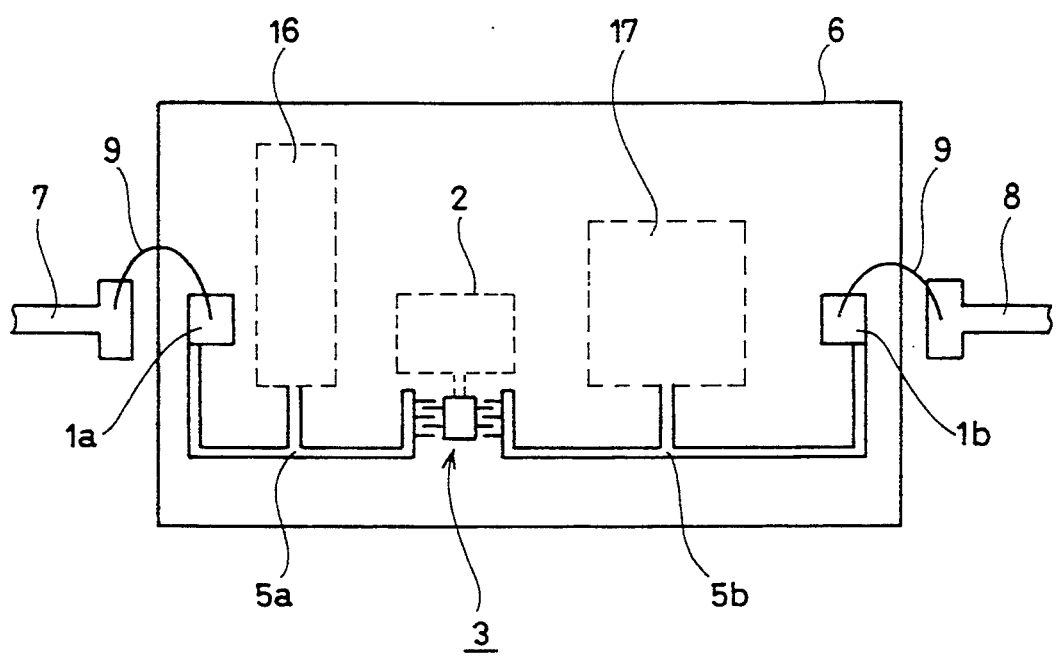
FIG. 1 schematically shows plane structures of a semiconductor device according to an embodiment of the invention.

FIG. 1 schematically shows plane structures of a semiconductor device according to an embodiment of the invention. The bonding pads 1a and 1b formed on an outer surface of the IC chip 6 are connected to the Vcc supply lead 7 and the reference (GND) supply lead 8 through the bonding wires 9, respectively. Other bonding pads and other leads formed on the surface of the IC chip 6 are not shown in the figures for simplicity reasons. On the major surface of the IC chip 6, there are disposed the internal circuit 2 for deciding the internal state as well as integrated circuits 16 and 17 for various functions. The Vcc supply interconnection 5a connected to the bonding pad 1a and thus the Vcc supply lead 7 is introduced to the integrated circuit 16, and has a divided end introduced to the interconnection connecting portion 3 for the internal circuit 2. The reference supply interconnection 5b connected to the bonding pad 1b and thus the GND supply lead 8 is introduced to the integrated circuit 17, and has a divided portion introduced to the interconnection connecting portion 3 for the internal circuit 2. To the interconnection connecting portion 3 are connected either the Vcc supply interconnection 5a or the reference supply interconnection 5b as well as the interconnection 4 for the internal circuit 2 in accordance with the specification of the semiconductor device, as will be described later.

Owing to the interconnection structures described above, the Vcc supply interconnection 5a and the reference supply interconnection 5b introduced to the internal circuit 2 can be formed by interconnections which are used as the interconnections introduced to the integrated circuits 16 and 17, respectively, without using interconnections dedicated to the internal circuit 2.

Figure 10:
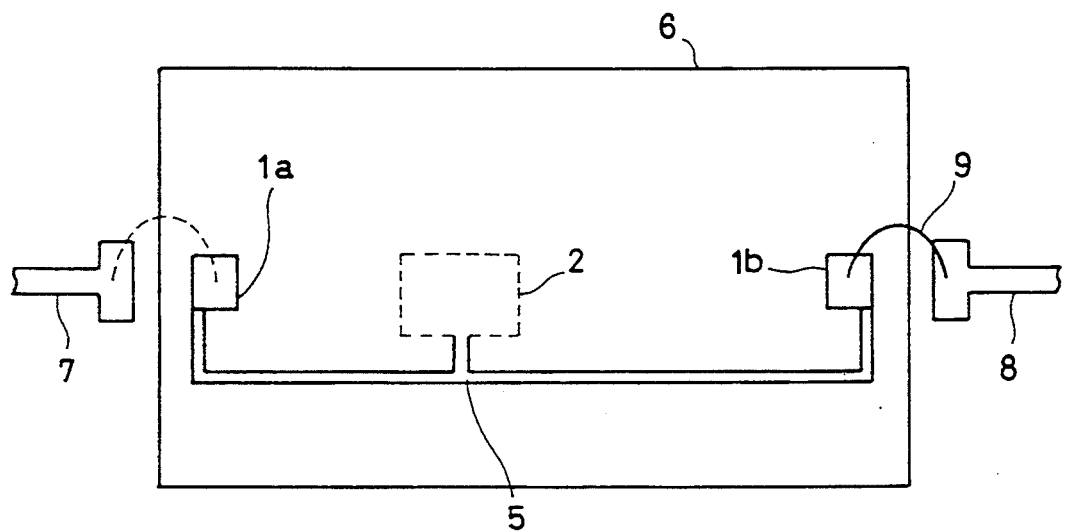
FIG. 10 shows plane structures of a semiconductor device of a bonding option type in the prior art.
Figure 11:
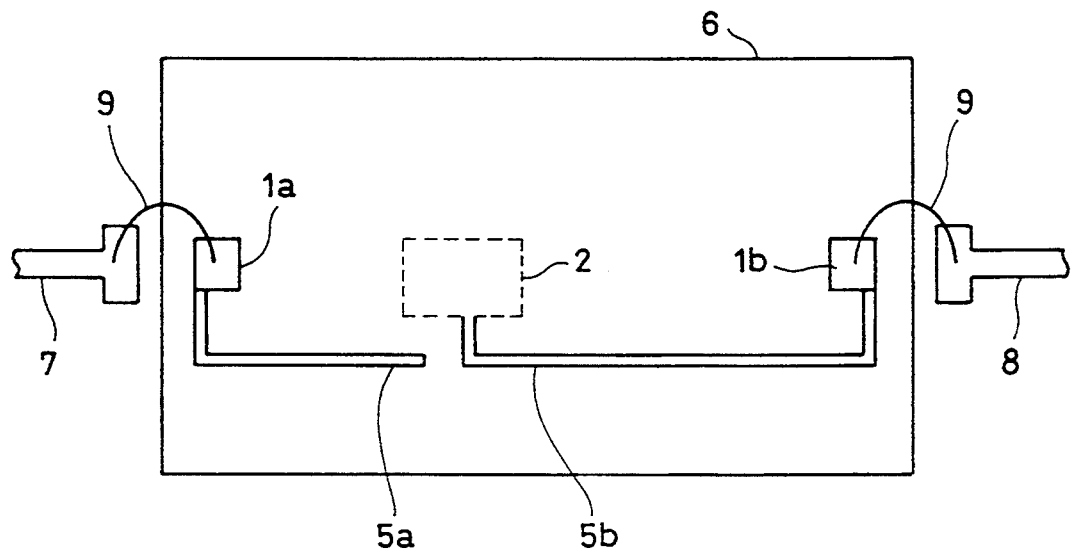
FIG. 11 shows plane structures of a semiconductor device of a master slice type in the prior art.
Figure 12:
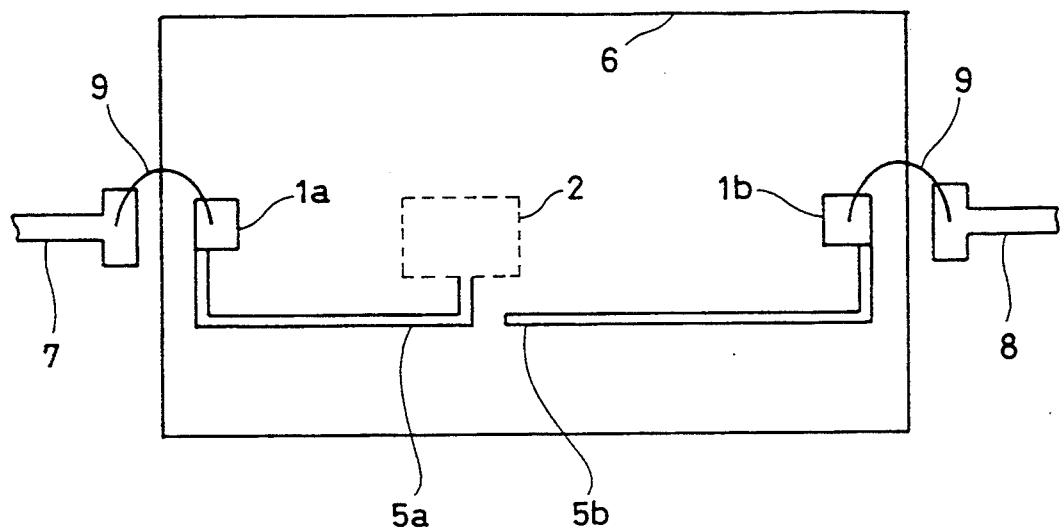
FIG. 12 shows plane structures of the other example of a semiconductor device of a master slice type in the prior art.

Therefore, the structures in the prior art shown in FIG. 10 can eliminate area for the unnecessary bonding pad 1a not connected to the internal circuit 2 and the dedicated power supply interconnection extending from the bonding pad 1a to the internal circuit 2. Consequently, the size of the IC chip 6 can be reduced.

Figure 2:
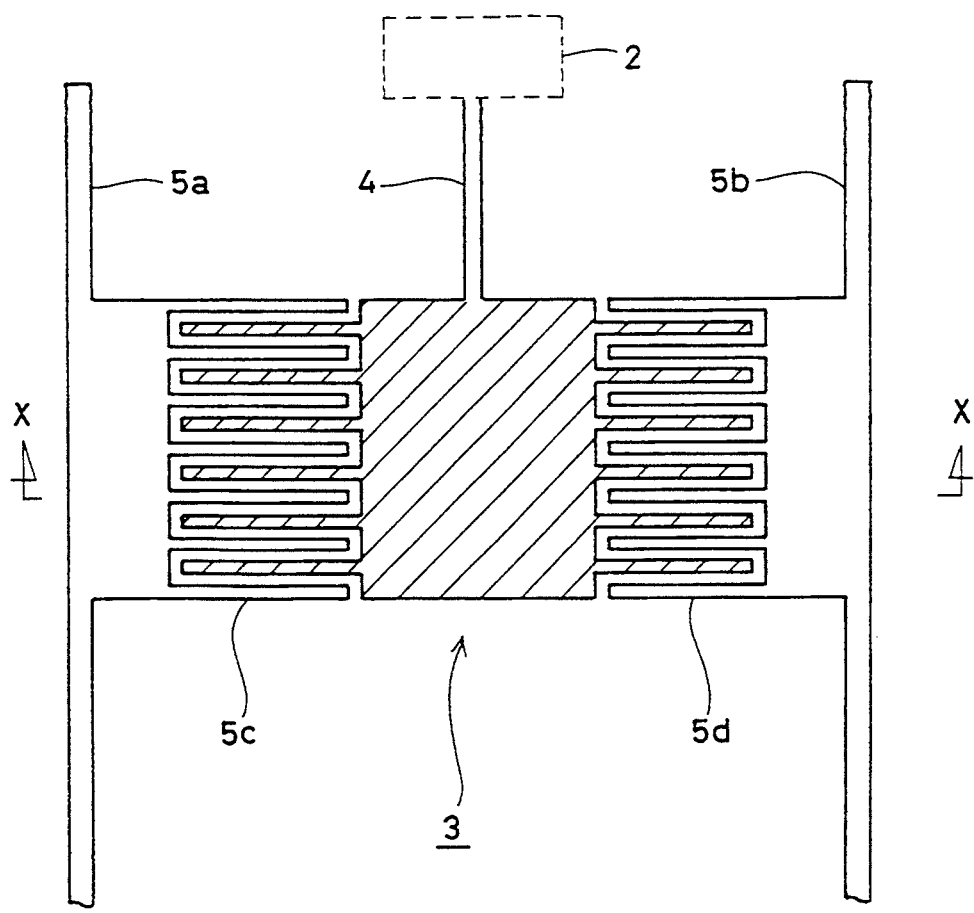
FIG. 2 shows a plane structure of an interconnection connecting portion of a semiconductor device according to a first embodiment of the invention.
Figure 3:
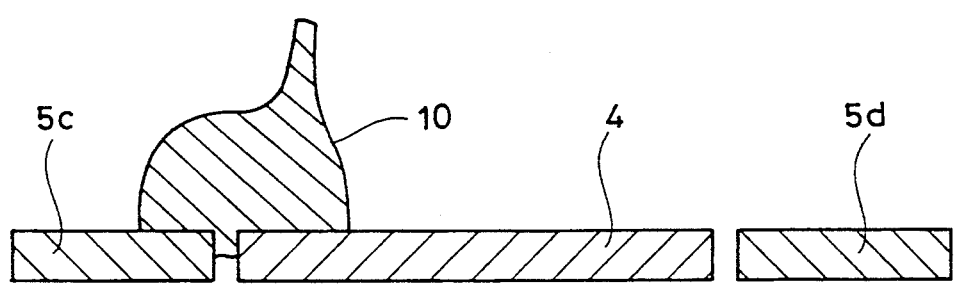
FIG. 3 is a cross section taken along line X—X in FIG. 2.

Then, the structure of the interconnection connecting portion 3 will be described below. FIG. 2 shows a plane structure of the interconnection connecting portion 3 of the semiconductor device according to a first embodiment of the invention. The interconnection 4 connected to the internal circuit 2 has a plurality of comb-like ends. The Vcc supply interconnection 5a and the reference supply interconnection 5b have ends 5c and 5d in the shape of the teeth of the comb, respectively, which engage with the comb-like ends of the interconnection 4. FIG. 3 is a cross section taken along line X—X in FIG. 2. Referring to FIG. 3, one of the comb-like ends of the interconnection 4 is connected to either the comb-like end 5c of the Vcc supply interconnection 5a or the comb-like end 5d of the reference supply interconnection 5b by a connecting member 10 made from the same material as the bonding wire 9 in FIG. 1. The connecting member 10 is formed by applying the bonding to the interconnection connecting portion 3 when applying the bonding to the leads 7 and 8 and the bonding pads 1a and 1b. The connecting member 10 is made from the bonding wire material such as gold or aluminium.

Figure 4:
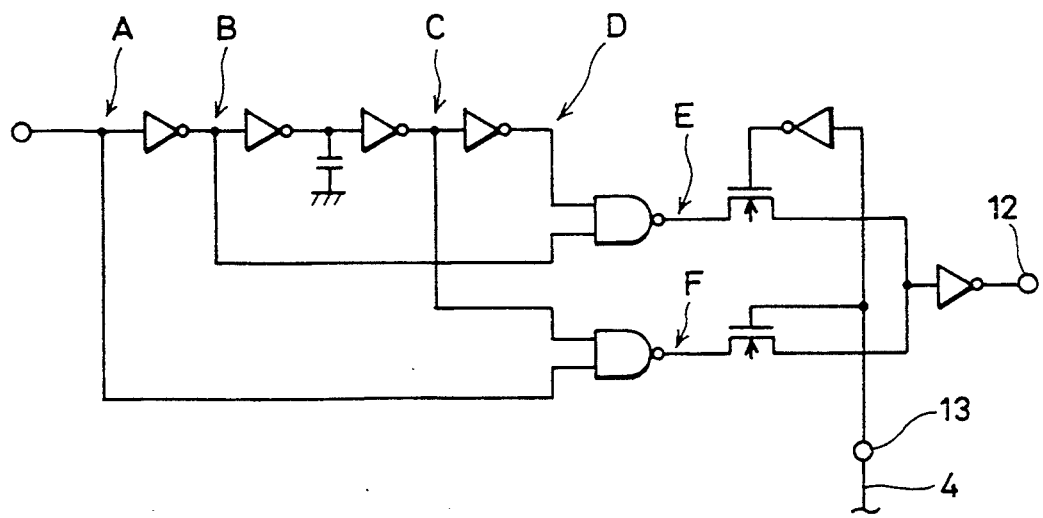
FIG. 4 is an equivalent circuit diagram of an internal circuit of a semiconductor device of the invention.
Figure 5:
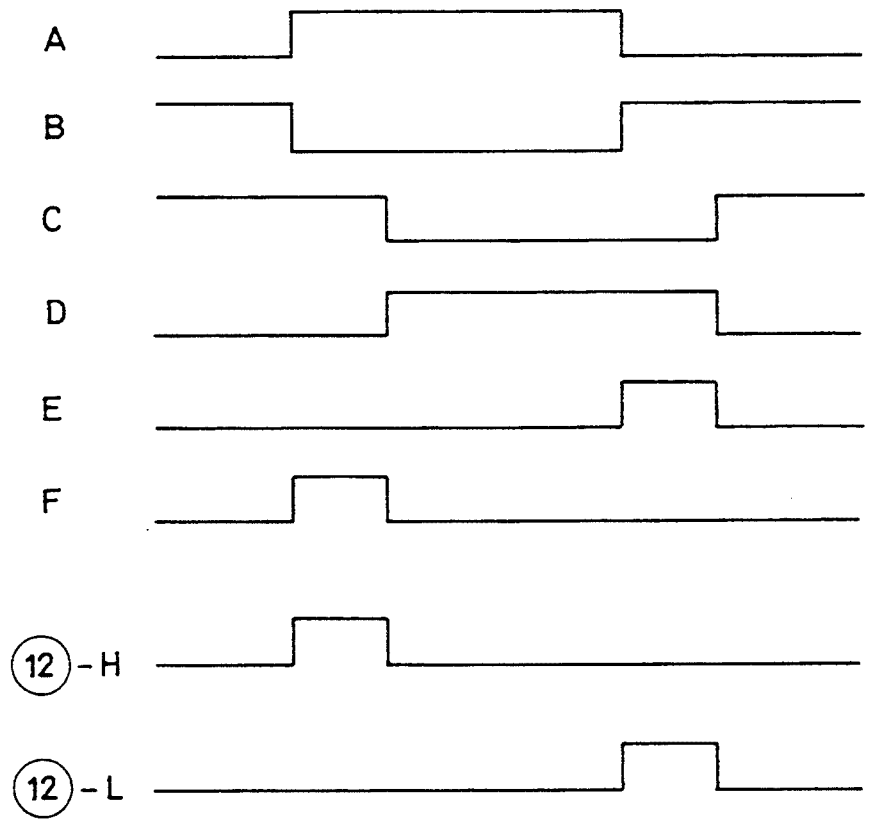
FIG. 5 is signal waveform diagram showing signal waveforms at respective points in an internal circuit shown in FIG. 4.

FIG. 4 is a circuit diagram showing an example of the internal circuit 2 to which either the Vcc supply interconnection 5a or the reference supply interconnection 5b is connected through the interconnection connection portion 3. FIG. 5 is a signal waveform diagram showing output signals at points A, B, . . . , F in the internal circuit 2 and an output terminal 12. Referring to FIGS. 4 and 5, if "H" is applied from the interconnection 4 to an input terminal 13, a signal of a pulse waveform indicated at "12-H" in FIG. 5 is supplied from the output terminal 12. If "L" is applied through the input terminal 13, a signal indicated at "12-L" is supplied from the output terminal 12.

Figure 6:
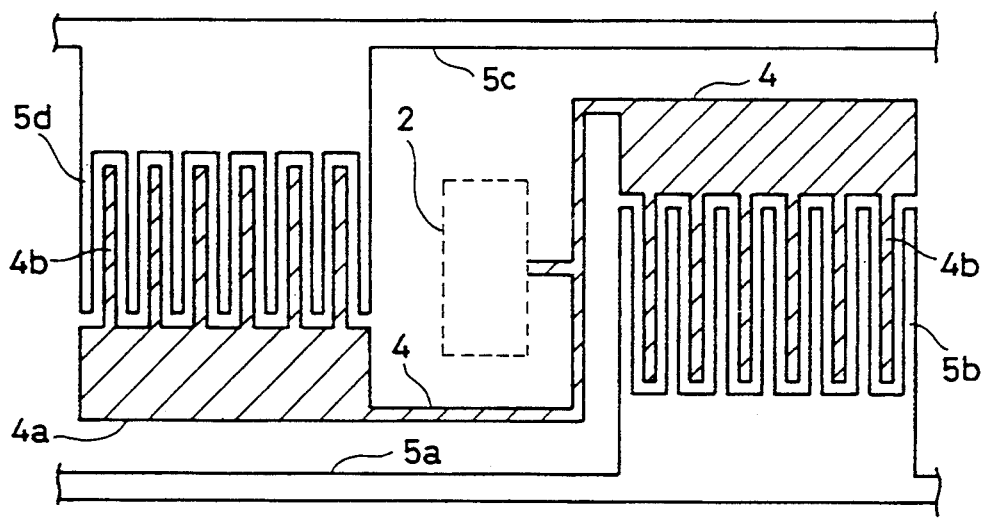
FIG. 6 shows a plane structure of an interconnection connecting portion of a semiconductor device according to a second embodiment of the invention.

FIG. 6 shows a plane structure of the interconnection connecting portion 3 according to a second embodiment of the invention. In this embodiment, the interconnection 4 connected to the internal circuit 2 is divided and extended toward the Vcc supply interconnection 5a and the reference supply interconnection 5b, so that the freedom in the layout or disposition of the respective connecting portions is improved.

Figure 7:
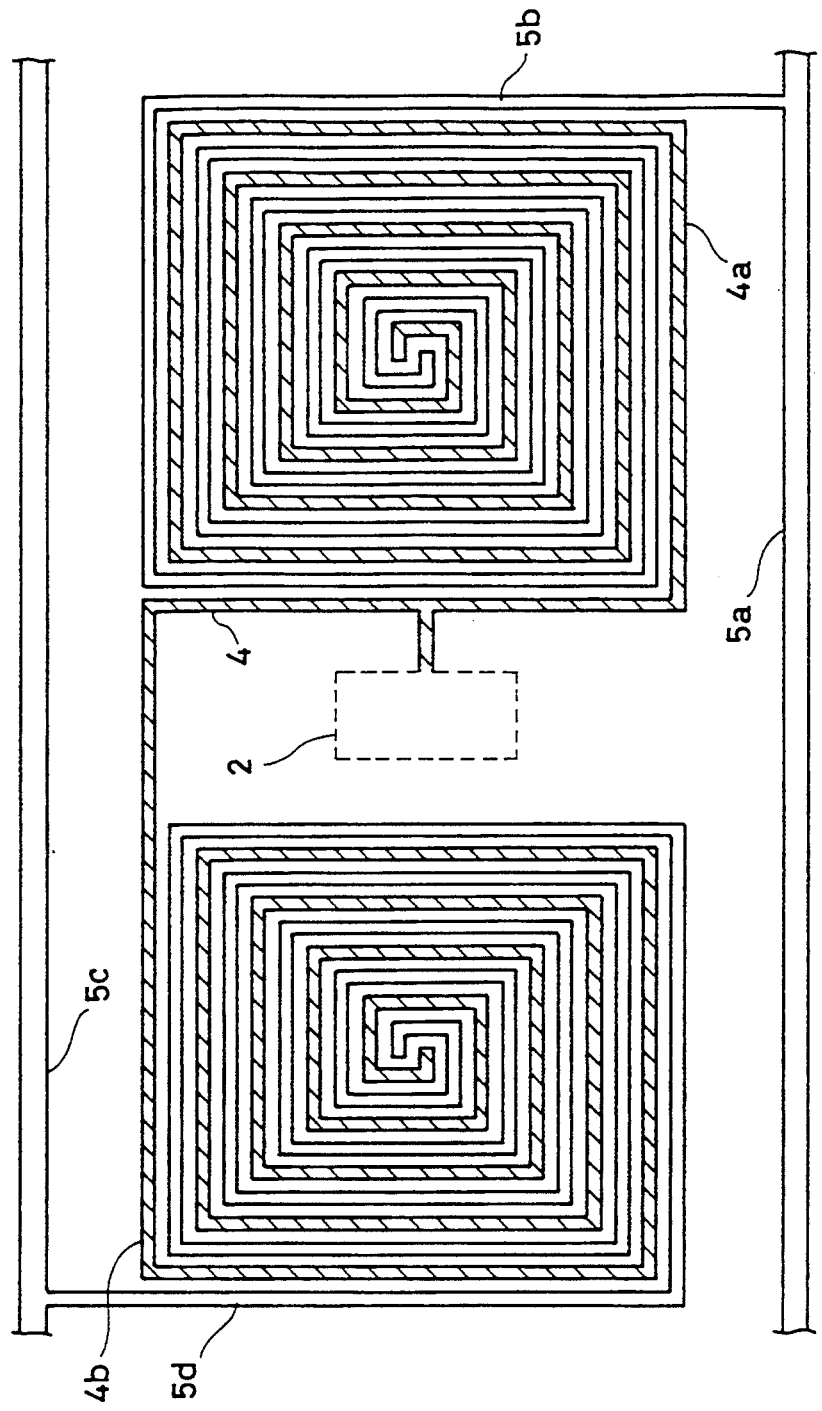
FIG. 7 shows a plane structure of an interconnection connecting portion of a semiconductor device according to a third embodiment of the invention.

Further, FIG. 7 shows a plane structure of the interconnection connecting portion 3 according to a third embodiment of the invention. In this embodiment, the ends of the interconnection 4 as well as the end 5b of the power supply interconnection 5a and the end 5d of the reference supply interconnection 5c are formed into spiral shapes.

Figure 8:
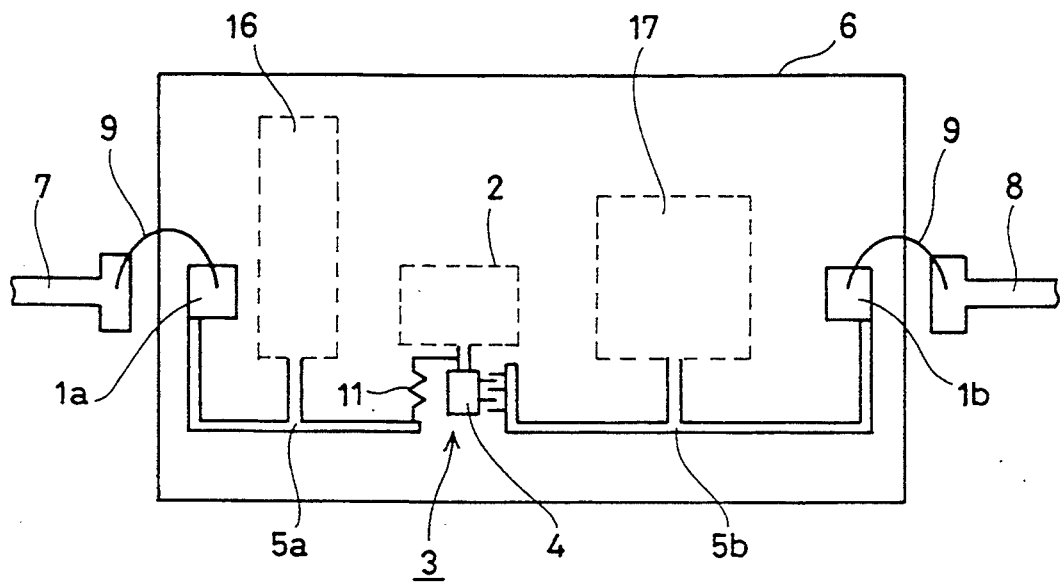
FIG. 8 shows plane structures of a semiconductor device of a fourth embodiment of the invention.
Figure 9:
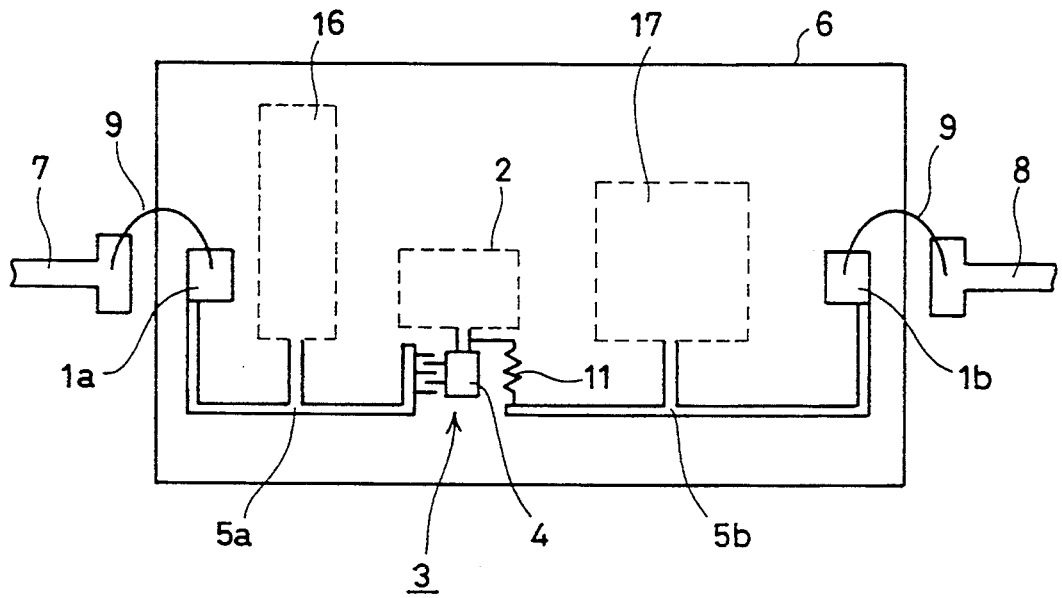
FIG. 9 shows plane structures of the other example of a semiconductor device of a fourth embodiment.

A fourth embodiment of the invention will be described below. FIGS. 8 and 9 schematically show plane structures of the semiconductor device according to the fourth embodiment. In the semiconductor device shown in FIG. 8, the internal circuit 2 and the Vcc supply interconnection 5a are connected through a high resistance element 11. The reference supply interconnection 5b and the internal circuit 2 can be connected through the interconnection connecting portion 3. If the end of the reference supply interconnection 5b is connected to the end of the interconnection 4 extending from the internal circuit 2, a signal of "L" is applied to the internal circuit 2. If not connected, the Vcc supply interconnection 5a applies a signal of "H". The example shown in FIG. 9 achieves the condition opposite to that shown in FIG. 8.

In the embodiments described hereinabove, the interconnections at the interconnection connecting portion 3 between the supply interconnections 5a and 5b and the internal circuit 2 have the comb-like shapes or spiral shapes, but they may have any other shapes provided that the ends of the interconnections can be adjacent to each other with the predetermined spaces therebetween, which are smaller than the width of the connecting portion of the bonding wire.

In the foregoing embodiments, description has been made on the cases that the interconnection structures are selectively formed in accordance with the various specifications applied to the one IC chip. However, these interconnection structures may be applied for constructing the interconnections connected to a circuit which is used, for example, in a manufacturing process and will not be used during the use of a product.

According to the embodiments, as described hereinabove, there are provided the internal circuit for deciding the internal state, and the connecting portion for the power supply interconnection disposed near the internal circuit for deciding the internal state, and the connection and disconnection between the internal circuit and the interconnection is selected in accordance with the specification of the semiconductor device. Therefore, the power supply interconnection connected to the internal circuit for deciding the internal state does not require the dedicated interconnection, and thus a space for the dedicated power supply interconnection which is not connected can be eliminated, which enables reduction of the area of the IC chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a major surface;
   a power supply lead opposed to said semiconductor substrate for receiving a predetermined electric potential;
   a power supply pad formed on a major surface of said semiconductor substrate;
   a power supply wire connecting said power supply pad and said power supply lead;
   a power supply interconnection pattern formed on said semiconductor substrate and electrically connected to said power supply pad;
   an internal circuit formed on said semiconductor substrate for selecting functions of the semiconductor device or inhibiting use of a circuit formed on said semiconductor substrate; and
   an internal circuit interconnection pattern connected to said internal circuit and formed on said semiconductor substrate, said internal circuit interconnection pattern having a portion adjacent a predetermined portion of said power supply interconnection pattern and separated therefrom by a space smaller than a diameter of said power supply wire connecting said power supply lead and said power supply pad.

2. A semiconductor device according to claim 1, wherein said internal circuit interconnection pattern and said power supply interconnection pattern respectively have linearly extending interconnection connecting portions, which are opposed to each other with a space smaller than the diameter of said power supply wire.

3. A semiconductor device according to claim 1, wherein said internal circuit interconnection pattern and said power supply interconnection pattern respectively have interconnection connecting portions each in a shape of teeth of a comb, and teeth of said interconnection connecting portions are opposed and fitted to each other with spaces smaller than the diameter of said power supply wire therebetween.

4. A semiconductor device according to claim 1, wherein said internal circuit interconnection pattern and said power supply interconnection pattern respectively have interconnection connecting portions each in a spiral shape, and spirals of said interconnection connecting portions are opposed and fitted to each other with a space smaller than the diameter of said power supply wire therebetween.

5. A semiconductor device according to claim 1, wherein said power supply interconnection pattern includes a first power supply interconnection pattern and a second power supply interconnection pattern, and at least one of said first and second power supply interconnection patterns is formed of a part of an interconnection extending from said power supply pad to a circuit other than said internal circuit.

6. A semiconductor device according to claim 1, wherein said power supply interconnection pattern includes a first power supply interconnection pattern and a second power supply interconnection pattern, and at least one of said first and second power supply interconnection patterns has an interconnection connecting portion which is opposed to said interconnection portion of said internal circuit interconnection pattern with a predetermined space therebetween.

7. A semiconductor device according to claim 6, wherein said first power supply interconnection pattern and said internal circuit interconnection pattern are connected through a resistor having a predetermined resistance, and said second power supply interconnection has an interconnection pattern connecting portion opposed to said interconnection pattern connecting portion of said internal circuit interconnection with a predetermined space therebetween.

8. A semiconductor device comprising:
   first and second power supply interconnection patterns to which predetermined electric potentials are to be applied, respectively;
   an internal circuit for selecting functions of the semiconductor device or inhibiting use of a circuit of the semiconductor device; and
   an internal circuit interconnection pattern connected to said internal circuit, wherein
   both of said first and second power supply interconnection patterns have interconnection connecting portions which are adjacent a predetermined portion of said internal circuit interconnection pattern and separated therefrom by predetermined spaces smaller than a diameter of a bonding wire for connecting the first and second power supply interconnection patterns to a power supply lead.

9. A semiconductor device according to claim 8, wherein said first power supply interconnection pattern receives a Vcc supply voltage, and said second power supply interconnection pattern receives a reference electric potential.

10. A semiconductor device comprising:
   first and second power supply interconnection patterns which are to receive predetermined electric potentials, respectively;
   an internal circuit for selecting functions of the semiconductor device or inhibiting use of a circuit of the semiconductor device; and an internal circuit interconnection pattern connected to said internal circuit, wherein said first power supply interconnection pattern and said internal circuit interconnection pattern are connected through a resistor having a predetermined resistance, and said second power supply interconnection pattern has an interconnection connecting portion adjacent said internal circuit interconnection pattern and separated therefrom by a predetermined space smaller than a diameter of a bonding wire for connecting the first and second power supply interconnection patterns to a power supply lead.

11. A semiconductor device according to claim 10, wherein said first power supply interconnection pattern receives a Vcc supply voltage, and said second power supply interconnection pattern receives a reference electric potential.

* * * * *

UNITED STATES PATENT AND TRADEMARK OFFICE
CERTIFICATE OF CORRECTION

PATENT NO. : 5,334,866
DATED : August 2, 1994
INVENTOR(S) : Kenji KUBO

It is certified that error appears in the above-indentified patent and that said Letters Patent is hereby corrected as shown below:

On the title page, delete item [75] and insert the following therefor:
--[75] Inventor: Kenji Kubo, Hyogo, Japan--.

Signed and Sealed this

Thirty-first Day of January, 1995

Attest:

BRUCE LEHMAN

*Attesting Officer*       *Commissioner of Patents and Trademarks*